(12) United States Patent
Brooks et al.

(10) Patent No.: US 7,049,848 B2
(45) Date of Patent: May 23, 2006

(54) LINEAR BUFFER

(75) Inventors: Todd L. Brooks, Laguna Beach, CA (US); Anilkumar V. Tammineedi, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/626,701

(22) Filed: Jul. 25, 2003

(65) Prior Publication Data

US 2005/0077944 A1 Apr. 14, 2005

Related U.S. Application Data

(62) Division of application No. 09/949,662, filed on Sep. 12, 2001, now Pat. No. 6,727,729.
(60) Provisional application No. 60/232,177, filed on Sep. 11, 2000, and provisional application No. 60/232,182, filed on Sep. 11, 2000.

(51) Int. Cl.
*H03K 19/0175* (2006.01)
*H03K 19/094* (2006.01)

(52) U.S. Cl. ............................. 326/68; 326/27; 326/83; 327/108; 327/379

(58) Field of Classification Search ................. 326/26, 326/27, 68, 86, 83; 327/108, 374, 379
See application file for complete search history.

(56) References Cited

U.S. PATENT DOCUMENTS

| | | | |
|---|---|---|---|
| 4,168,471 A | 9/1979 | Sampei | |
| 5,365,199 A | 11/1994 | Brooks | |
| 5,666,070 A | 9/1997 | Merritt et al. | |
| 5,694,065 A * | 12/1997 | Hamasaki et al. | 327/108 |
| 5,786,711 A | 7/1998 | Choi | |
| 6,043,690 A | 3/2000 | Krymski et al. | |
| 6,433,592 B1 * | 8/2002 | Ehben | 327/108 |
| 6,727,729 B1 * | 4/2004 | Brooks et al. | 326/68 |
| 6,753,708 B1 * | 6/2004 | Koch et al. | 327/112 |

FOREIGN PATENT DOCUMENTS

DE 196 35 024 10/1997

OTHER PUBLICATIONS

Copy of the International Search Report for International Application No. PCT/US01/28320, issued by the ISA, EP on Nov. 3, 2003, 9 pages.
Patent Abstracts of Japan, vol. 010, No. 150, May 31, 1986, & JP 61 010305 A, Jan. 17, 1986, Abstract.

* cited by examiner

*Primary Examiner*—Daniel Chang
(74) *Attorney, Agent, or Firm*—Sterne, Kessler, Goldstein & Fox P.L.L.C.

(57) ABSTRACT

A source-follower transistor based buffer provides high linearity. A replica transistor is used to generate a replica voltage substantially equal to the output voltage of the buffer. The replica voltage is level shifted by a level shift circuit and applied at the drain of the source-follower transistor to improve the linearity of the buffer. The buffer may be used in conjunction with a switched-capacitor sampling circuit. A damping circuit may be used to reduce charge glitches due to sampling. The damping circuit may be a low pass filter. The buffer may be used in an interface circuit that produces an output signal from an input signal and controls the level of the output signal.

18 Claims, 12 Drawing Sheets

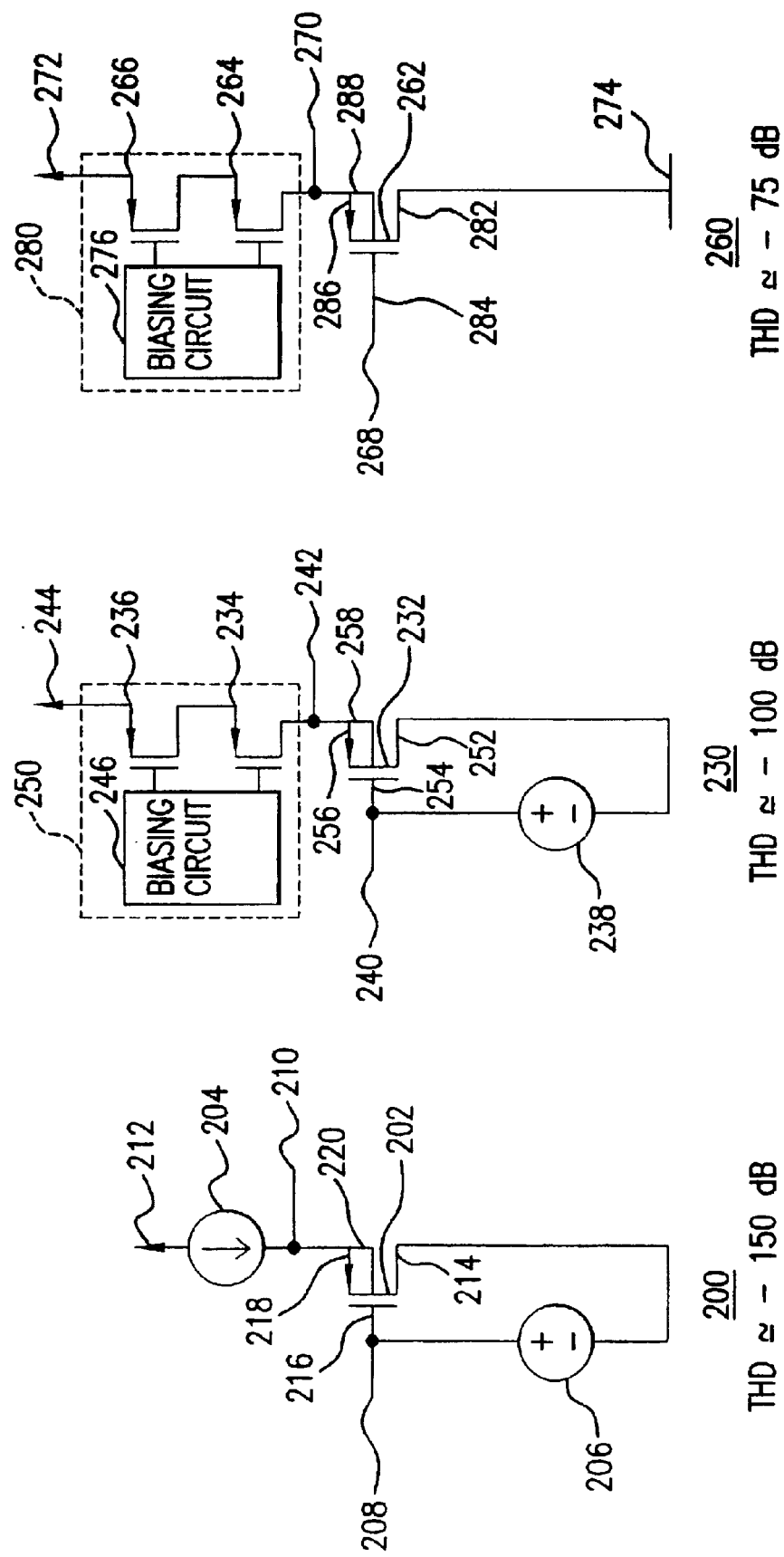

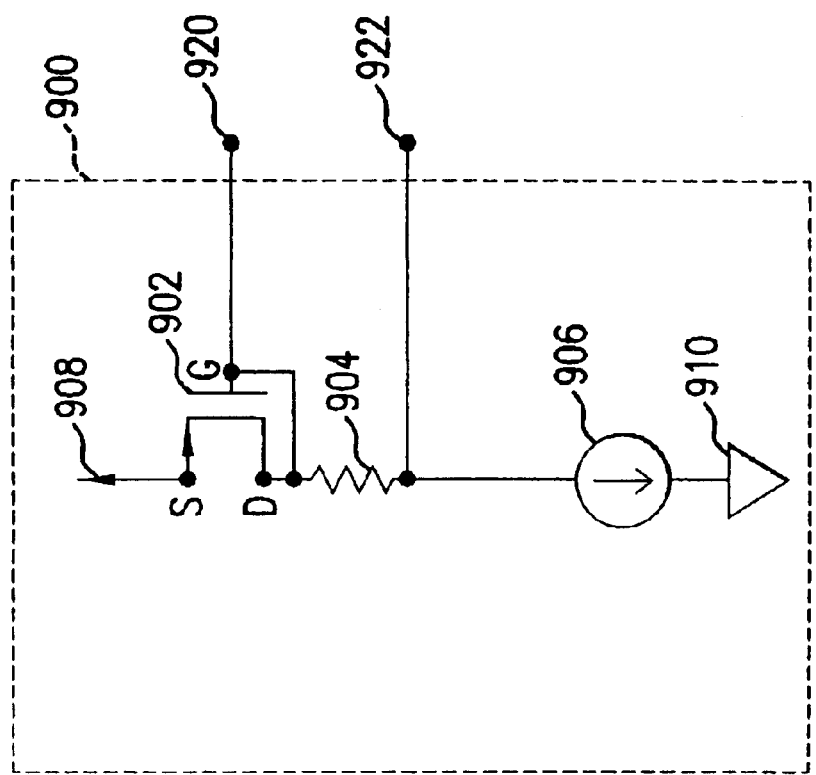
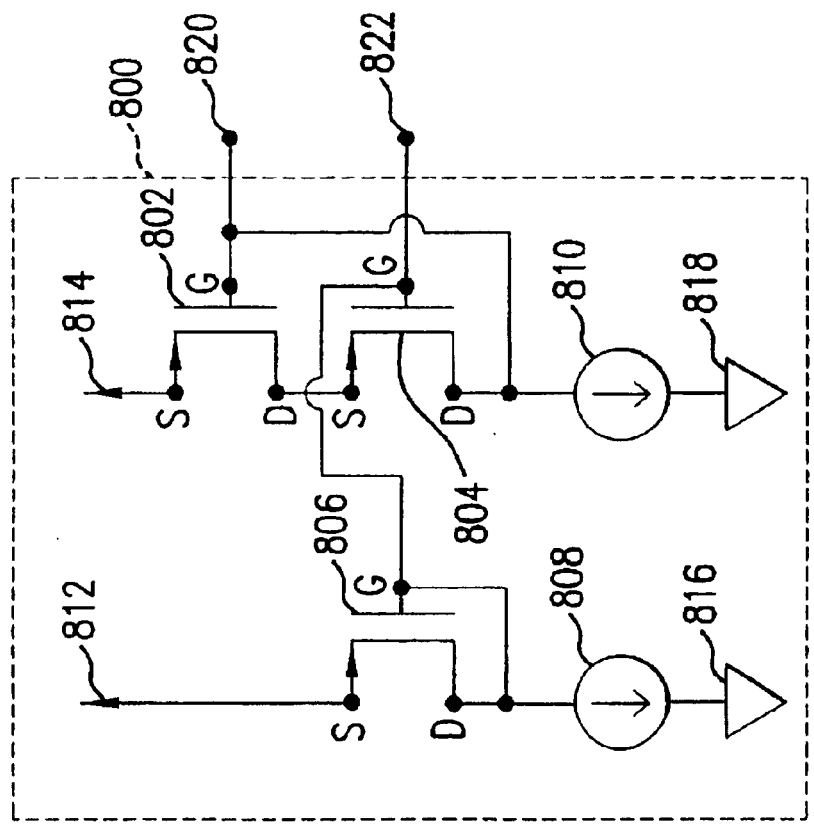
FIG.9
FIG.8

LINEAR BUFFER

CROSS-REFERENCE TO RELATED APPLICATIONS

This patent application is a divisional of application Ser. No. 09/949,662, filed Sep. 12, 2001 now U.S. Pat. No. 6,727,729, which claims priority to and is entitled to the benefit of:

1. Provisional Patent Application Ser. No. 60/232,177, filed Sep. 11, 2000 entitled "Linear Buffer Circuit;" and
2. Provisional Patent Application Ser. No. 60/232,182, filed Sep. 11, 2000 entitled "SLIC Interface with Linear Buffer Circuit."

These provisional applications are incorporated herein by reference in their entirety.

BACKGROUND OF THE INVENTION

1. Field of the Invention

The present invention generally relates to electronic circuitry. More particularly, the present invention relates to buffers.

2. Background Art

Buffer circuits typically are used to drive a low impedance while providing a high input impedance. For example, buffer circuits may be used at the interface of continuous-time and discrete-time circuits such as switched-capacitor sampling circuits to avoid the effects caused by sampling of the preceding continuous-time signal. Accordingly, buffer circuits are commonly used at the input of switched-capacitor based analog-to-digital converters (ADCs) such as sigma-delta ADCs, pipeline ADCs, algorithmic ADCs, etc.

A source-follower transistor is conventionally used as a buffer. In their simplest forms, source-follower transistor based buffers do not often meet the high linearity characteristics desired for many buffer circuit applications. In addition, charge glitches caused by a sampling circuit that follows a buffer circuit are typically coupled to the buffer circuit's input terminal through a parasitic capacitance "$C_{gs}$" of the source-follower transistor. This coupling can degrade the linearity of preceding continuous-time signals at the buffer circuit input. Accordingly, there is a need for a buffer circuit having high linearity.

Furthermore, buffer circuits, such as ones based on source-follower transistors, often generate an output signal having a level that is offset from the level of the corresponding buffer circuit input signal. It is often desirable to control the level of buffer output signals.

In addition, the level of a buffer circuit input signal may affect buffer circuit performance. Therefore, it is also often desirable to control the level of buffer input signals.

BRIEF SUMMARY OF THE INVENTION

The present invention provides buffer circuits that generate output signals from input signals with high linearity. In addition, the present invention provides buffer circuits that are capable of setting buffer input and output signal levels.

In one aspect of the present invention, a buffer includes a source-follower transistor adapted to generate an output signal from an input signal. A replica transistor is adapted to generate a replica signal from the input signal. A level-shifted replica signal generated by a level shifting circuit and provided at a terminal of the source-follower transistor. This level-shifted replica signal has a value so that the source-follower transistor is in saturation.

In a further aspect of the present invention, an interface circuit produces an output signal having an output signal level from an input signal and a reference signal. The input and output signals may be differential or single-ended. The output signal has an output direct current (dc) voltage level that is substantially equal to a dc voltage level of the reference signal. The interface circuit includes a level translation module that generates an input level control signal from the reference signal. A level adjustment module produces an adjusted buffer input signal from the input signal. The adjusted buffer input signal has a dc voltage level that is substantially equal to a dc voltage level of the input level control signal. A buffer generates the output signal from the adjusted buffer input signal.

The level translation module may include a replica buffer that generates a replica buffer output signal from the reference signal. In addition, the level translation module may include a difference amplifier, such as an operational amplifier (op-amp). The difference amplifier has a positive input terminal that receives the reference signal, a negative input terminal that receives the replica buffer output signal, and an output terminal that generates the input level control signal. The buffer and the replica buffer may both operate with substantially equal offsets.

In yet a further aspect of the present invention, a circuit includes a buffer, a sampling circuit having a switch, and a damping circuit coupled to the buffer and the sampling circuit. The damping circuit reduces charge glitches when the switch closes. The damping circuit may include a low pass filter, such as an RC low pass filter.

BRIEF DESCRIPTION OF THE DRAWINGS/FIGURES

FIGS. 2A–2C are diagrams of source-follower transistor based buffers;

Figure 7A:
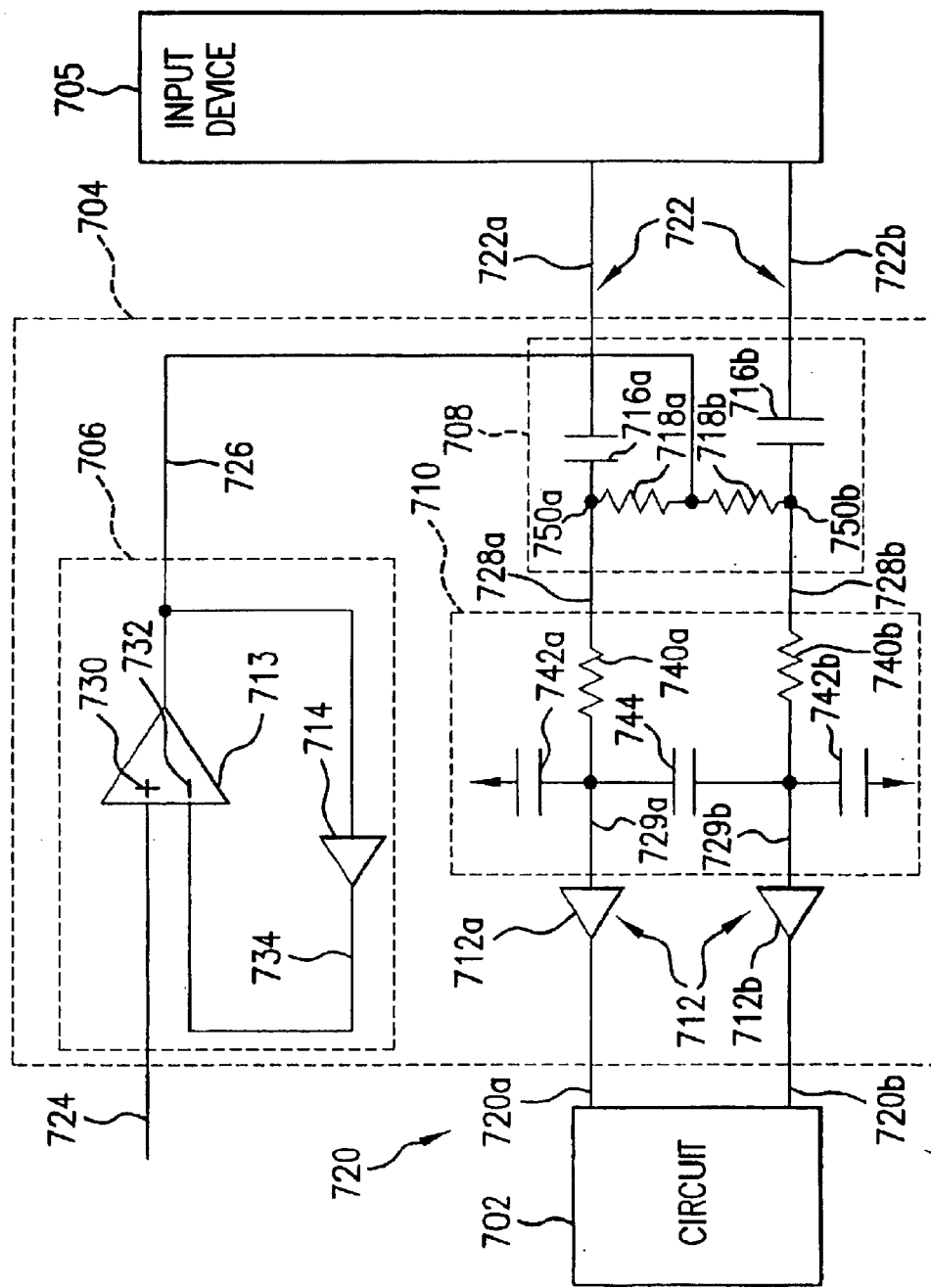
Figure 7B:
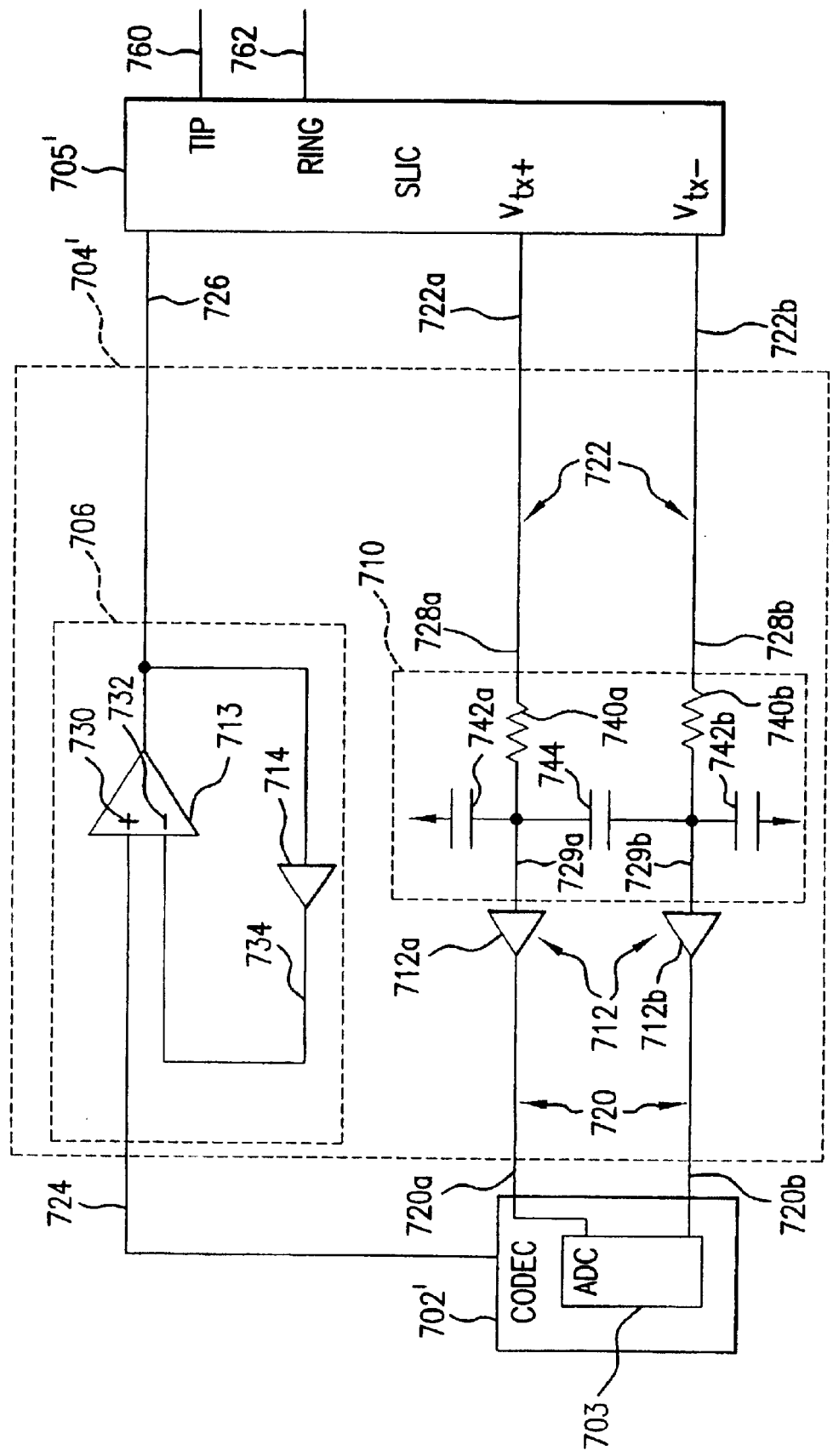
Figure 7C:
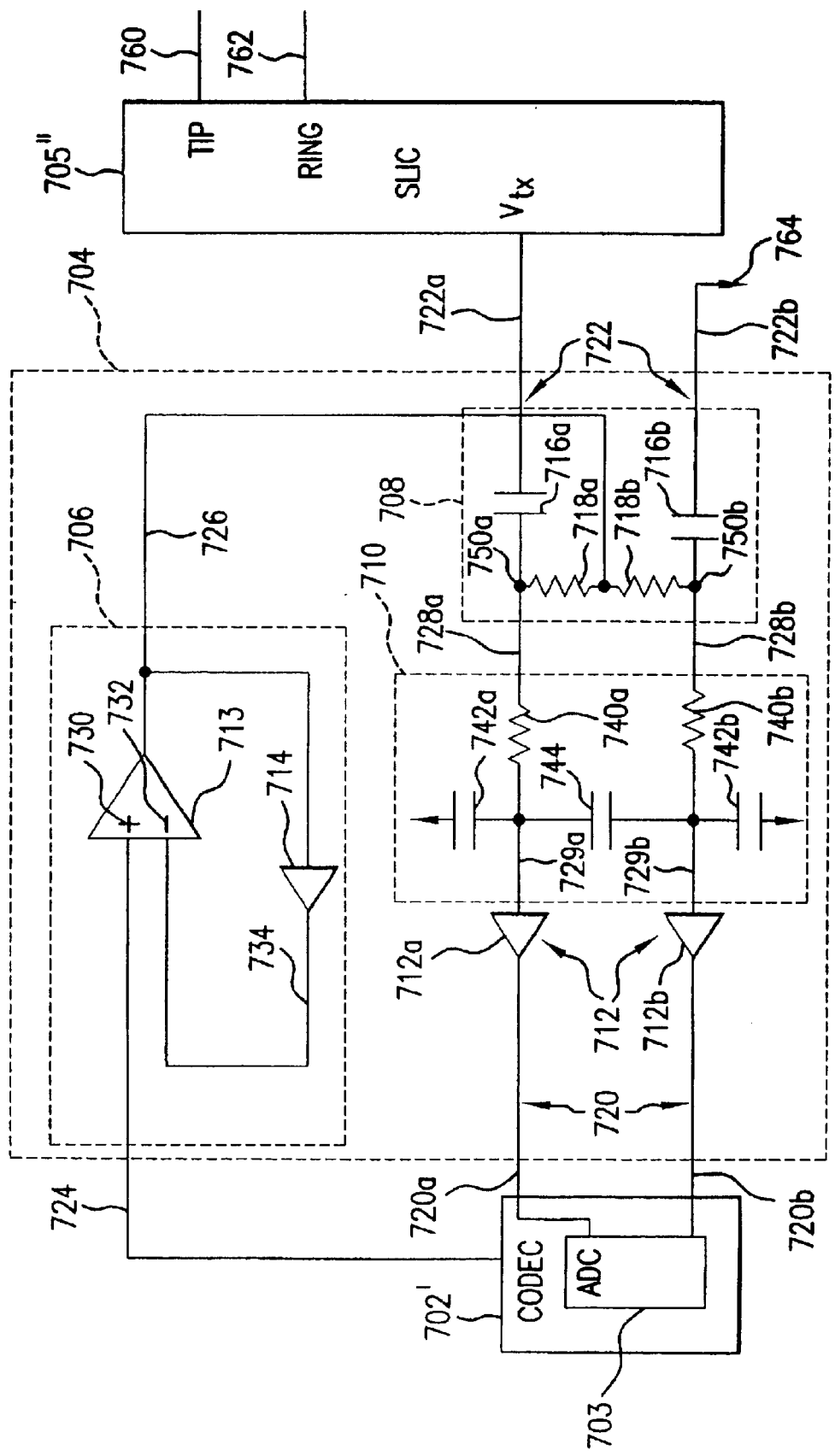

FIGS. 7A–C are diagrams of interface circuit applications that set differential input and output common mode levels; and FIGS. 8–11 provide examples of biasing circuit implementations.

DETAILED DESCRIPTION OF THE INVENTION

I. Introduction

In buffer circuit applications, the linearity of a source-follower transistor typically depends on a constant amount of current flowing through the source-follower transistor. When the magnitude of the current flowing through the source-follower transistor (i.e., the drain-source current) changes with the input signal level (an occurrence referred to herein as a signal-dependent current), the linearity of the source-follower transistor is compromised.

Signal-dependent currents in source-follower transistors may be the result of various causes. One such cause is the gmb effect, in which signal dependent $V_t$ variation results when the body of the source-follower transistor is not tied to the transistor's source terminal. Coupling the body of the transistor to the source terminal reduces signal dependent currents that are associated with the gmb effect.

A limited current source output impedance is another cause of signal dependent currents. This cause may be alleviated by coupling the source terminal of a source-follower transistor to a high output impedance current source, such as a cascode current source or a gain-boosted current source to increase the output impedance of the source-follower transistor.

Figure 1B:
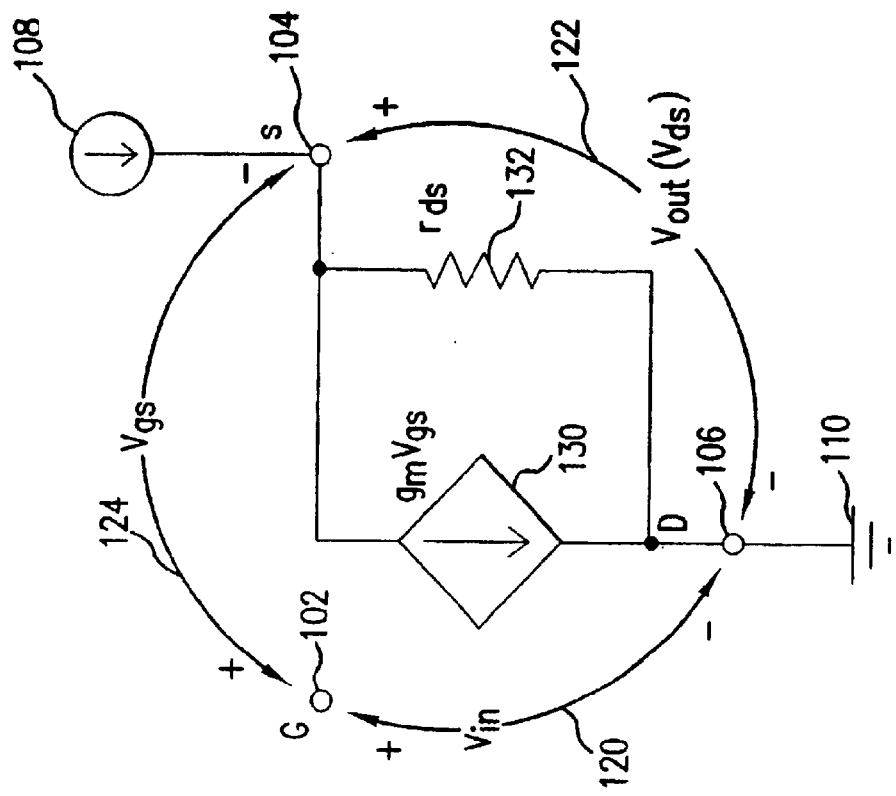
FIGS. 1A and 1B are diagrams of a source-follower transistor and its small signal equivalent circuit.

Signal dependent currents may also be caused by $r_{ds}$ modulation with signal dependent $V_{ds}$ variation. This variation can be explained with reference to a small signal equivalent circuit model of a source-follower transistor. Accordingly, FIGS. 1A and 1B are diagrams of an exemplary source-follower transistor and its small signal equivalent circuit, respectively.

Figure 1A:
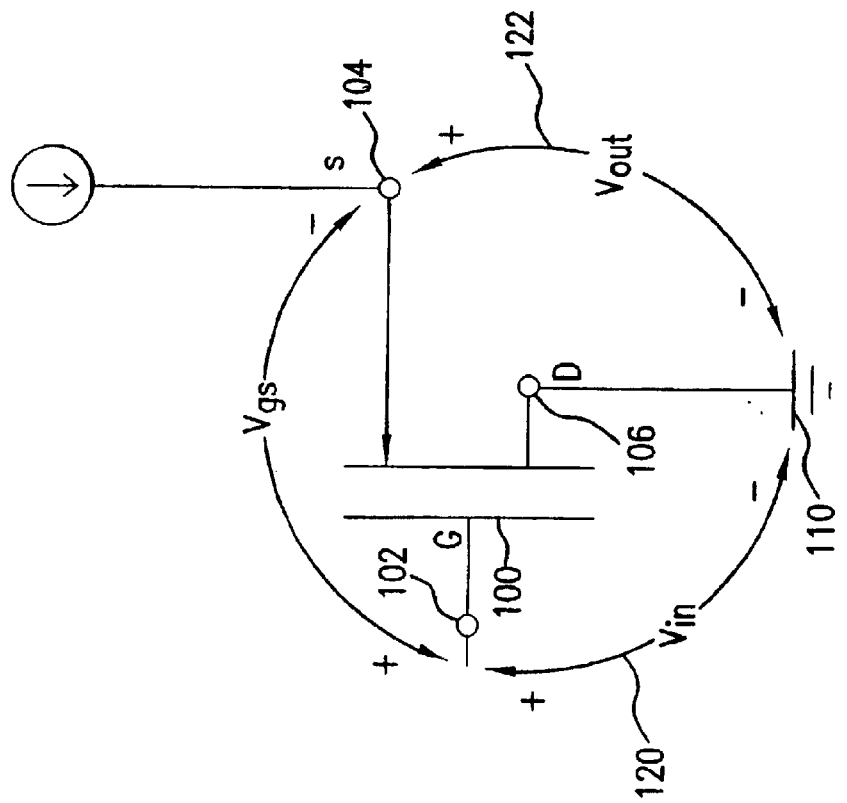

FIG. 1A illustrates a source-follower transistor (in this case, a P-channel metal oxide semiconductor field effect transistor (MOSFET)) 100 having a gate terminal 102, a source terminal 104, and a drain terminal 106. Source terminal 104 is coupled to a current source 108, while drain terminal 106 is coupled to a ground node 110. Gate terminal 102 receives an input signal 120, such as a continuous time voltage waveform. From input signal ($V_{in}$) 120, source-follower transistor 100 generates a corresponding output signal ($V_{out}$) 122 at source terminal 104.

Details regarding the generation of output signal 122 from input signal 120 are described with reference to the small signal equivalent circuit shown in FIG. 1B. This small signal equivalent circuit is used to describe incremental changes in currents and voltages of source-follower transistor 100. As shown in FIG. 1B, the small signal equivalent circuit of source-follower transistor 100 includes a voltage-dependent current source 130 and an output impedance $r_{ds}$ (represented by resistor 132) that is in parallel with current source 130.

The current in voltage-dependent current source 130 is proportional to the voltage between gate terminal 102 and source terminal 104 (shown in FIGS. 1A and 1B as $V_{gs}$ 124) according to a transconductance gain. This gain is shown in FIG. 1B as $g_m$. Accordingly, as the magnitude of $V_{gs}$ increases, so does the current produced by voltage-dependent current source 130.

Since the source terminal 104 of source-follower transistor 100 is coupled to current source 108, any change in the current generated by voltage-dependent current source 130 will be offset by a contrary change in the current flowing through output impedance 132. According to Ohm's law, any change in this current will result in a proportional change in the voltage across source terminal 104 and drain terminal 106 (shown as "$V_{out}$" in FIGS. 1A–1B). Such changes in $V_{out}$ will alter the operating point of transistor 100, and consequently affect the magnitude of the current that flows through transistor 100. Thus, source-follower transistor 100 operates with signal-dependent currents.

FIGS. 2A–2C provide examples of buffer circuits that each employ a source-follower transistor. Each of these illustrated examples exhibits a particular level of non-linear performance due to signal-dependent currents. This nonlinear performance is described below in terms of harmonic distortion. Harmonic distortion is a form of nonlinear distortion in a system, such as a buffer, that is characterized by the system outputting harmonics of an input sinusoidal signal. Total Harmonic Distortion (THD) is a measurement that represents the total energy in such harmonics divided by the energy in the sinusoidal input signal.

Accordingly, THD measurements are shown in FIGS. 2A–2C for each of the illustrated circuits shown. These THD values are derived from circuit simulations involving a 4 kiloHertz (kHz), 1.0 Volt peak-to-peak ($V_{pp}$) input signal in a 3.3 Volt, 0.18µ complementary metal oxide semiconductor (CMOS) process. These THD values are for continuous-time signals with no sampling circuits coupled to the output terminals. The connection of sampling circuits may result in greater levels of distortion attributed to occurrences referred to as charge glitches, which are described in greater detail below.

FIG. 2A is a buffer 200 based on a source-follower transistor 202. As shown in FIG. 2A, transistor 202 is a P-channel MOSFET. However, other types of transistors may be employed. Transistor 202 includes a drain terminal 214, a gate terminal 216, a source terminal 218, and a body 220. Drain terminal 214 is coupled to a negative terminal of an ideal 400 millivolt (mV) voltage source 206. Gate terminal 216 is coupled to a positive terminal of voltage source 206. Gate terminal 216 receives an input signal 208 from a preceding circuit (not shown).

Buffer 200 includes an ideal current source 204 having a first terminal that is connected to source terminal 218 and body 220. Current source 204 also has a second terminal that is coupled to a voltage supply 212.

Source terminal 218 provides an output signal 210. As shown in FIG. 2A, buffer 200 exhibits a THD of approximately −150 dB when operating according to the simulation conditions described above.

FIG. 2B is a schematic of a buffer 230 that is based on a source-follower transistor 232. Transistor 232 is a P-channel MOSFET. However, other types of transistors may be employed. Transistor 232 includes a drain terminal 252, a gate terminal 254, a source terminal 256, and a body 258. Drain terminal 252 is coupled to a negative terminal of an ideal 400 mV voltage source 238. Gate terminal 254 is coupled to a positive terminal of voltage source 238. Gate terminal 254 also receives an input signal 240 from a preceding circuit (not shown).

A high impedance current source 250 is coupled to source terminal 256 and body 258. As shown in FIG. 2B, current source 250 includes a current source transistor 236, and a cascode transistor 234. Transistors 234 and 236 are each P-channel MOSFETs. However, other types of transistors may be employed. Current source 250 also includes a biasing circuit 250, which establishes predetermined voltage levels at the gate terminals of transistors 234 and 236. Details regarding biasing circuit 246 implementations are provided below with reference to FIGS. 8–11.

Buffer 230 produces an output signal 242 at source terminal 256. As shown in FIG. 2B, buffer 230 exhibits a THD of approximately −100 dB when operating according to the simulation conditions described above.

FIG. 2C is a schematic of a buffer 260 that is based on a source-follower transistor 262. Transistor 262 is a P-channel MOSFET. However, other types of transistors may be employed. Transistor 262 includes a drain terminal 282, a gate terminal 284, a source terminal 286, and a body 288. Drain terminal 282 is coupled to a ground terminal 274. Gate terminal 284 receives an input signal 268 from a preceding circuit (not shown).

A high impedance current source 280 is coupled to source terminal 286 and body 288. As shown in FIG. 2C, current source 280 includes a current source transistor 266, and a cascode transistor 264. Transistors 264 and 266 are each P-channel MOSFETs. However, other types of transistors may be employed. Current source 280 also includes a biasing circuit 276. Details regarding biasing circuit 276 implementations are provided below with reference to FIGS. 8–11.

Buffer 260 produces an output signal 270 at source terminal 286. As shown in FIG. 2C, buffer 260 exhibits a THD of approximately −75 dB when operating according to the simulation conditions described above.

II. Improved Linearity Buffer Circuit

Figure 3:
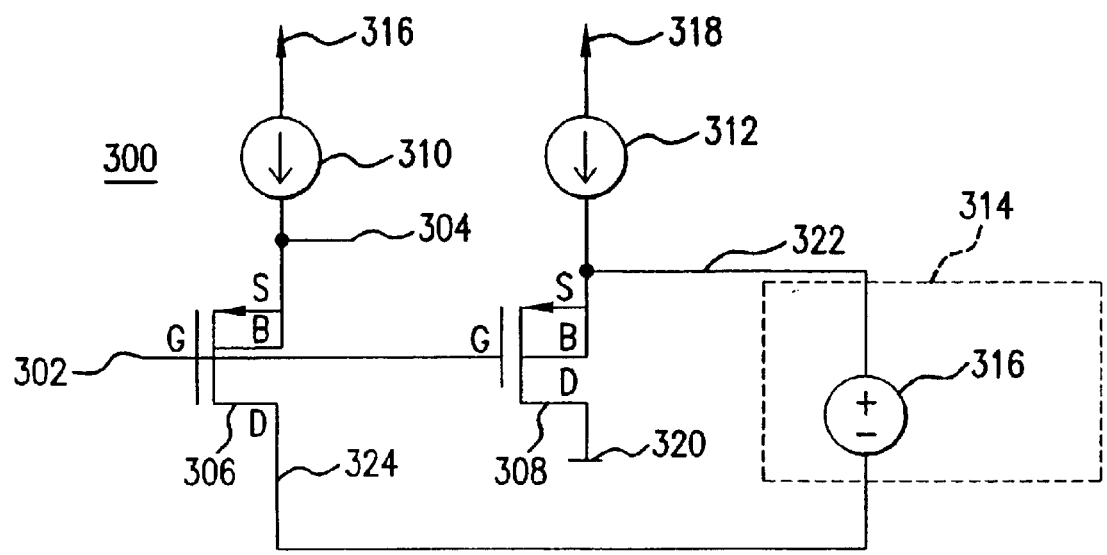
FIGS. 3 and 4 are diagrams of increased linearity buffers.

FIG. 3 is a diagram of a buffer 300 according to an embodiment of the present invention. Buffer 300 includes a source-follower transistor 306, a replica transistor 308 (also referred to herein as replica device 308), current sources 310 and 312, and a level shifting circuit 314.

As shown in FIG. 3, transistors 306 and 308 each include source (S), gate (G), drain (D), and body (B) terminals. For each of these transistors, the source and body terminals are tied together. The source terminals of transistors 306 and 308 are coupled to current sources 310 and 312, respectively. In turn, current sources 310 and 312 are coupled to voltage supplies 316 and 318, respectively.

Buffer 300 receives an input signal 302 at the gate terminals of source-follower transistor 306 and replica transistor 308. From this input signal, buffer 300 generates an output signal 304 at the source terminal of transistor 306. Buffer 300 also generates a replica signal 322 at the source terminal of replica transistor 308. Replica signal 322 is substantially the same as output signal 304.

As shown in FIG. 3, level shifting circuit 314 includes a voltage source 316 coupled between the source terminal of transistor 308 and the drain terminal of transistor 306. Thus, level shifting circuit 314 operates to provide a level-shifted replica signal 324 at the drain of source-follower transistor 306. In an embodiment, signal 324 has a direct current (dc) voltage level that is offset from the dc voltage level of replica signal 322 by an amount that keeps the source-follower transistor 306 in saturation.

This level shifting feature drastically reduces signal-dependent $V_{ds}$ variation by maintaining a substantially constant $V_{ds}$ for source-follower transistor 306. Consequently signal dependent current variation in source follower transistor 306 is also reduced. As a result, buffer 300 exhibits improved linearity. In addition, buffer 300 preferably maintains substantially constant $V_{ds}$ across source-follower transistor 306 without affecting the signal swing of buffer 300. Thus, this improvement in linearity is achieved without losing signal swing.

Figure 4:
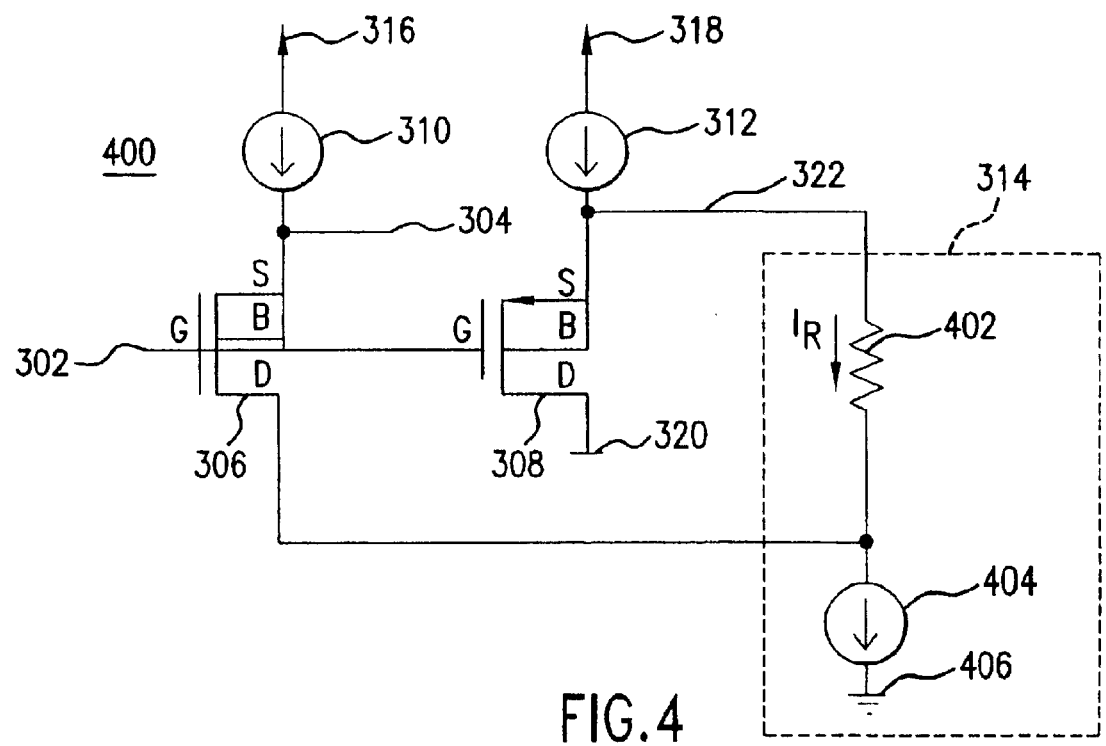

FIG. 4 is a schematic of a buffer 400 according to a further embodiment of the present invention. Buffer 400 is similar to buffer 300. However, in buffer 400, level shifting circuit 314 of buffer 300 includes a resistor 402 having a resistance R, and a current source 404. As shown in FIG. 4, a first terminal of resistor 402 is coupled to the source terminal of transistor 308. A second terminal of resistor 402 is coupled to current source 404 and the drain terminal of transistor 306. Current source 404 has a first terminal that is connected to resistor 402 and the drain terminal of transistor 306, and a second terminal that is coupled to a ground node 406.

Buffer 400 achieves a level shift between the source terminal of transistor 308 and the drain terminal of transistor 306 through a voltage drop across resistor 402. This voltage drop has a magnitude of $I_R R$, where $I_R$ is the current passing through resistor 402. The voltage drop $I_R R$ is preferably selected to keep source-follower transistor 306 in saturation.

III. Damping Circuit

Figure 5A:
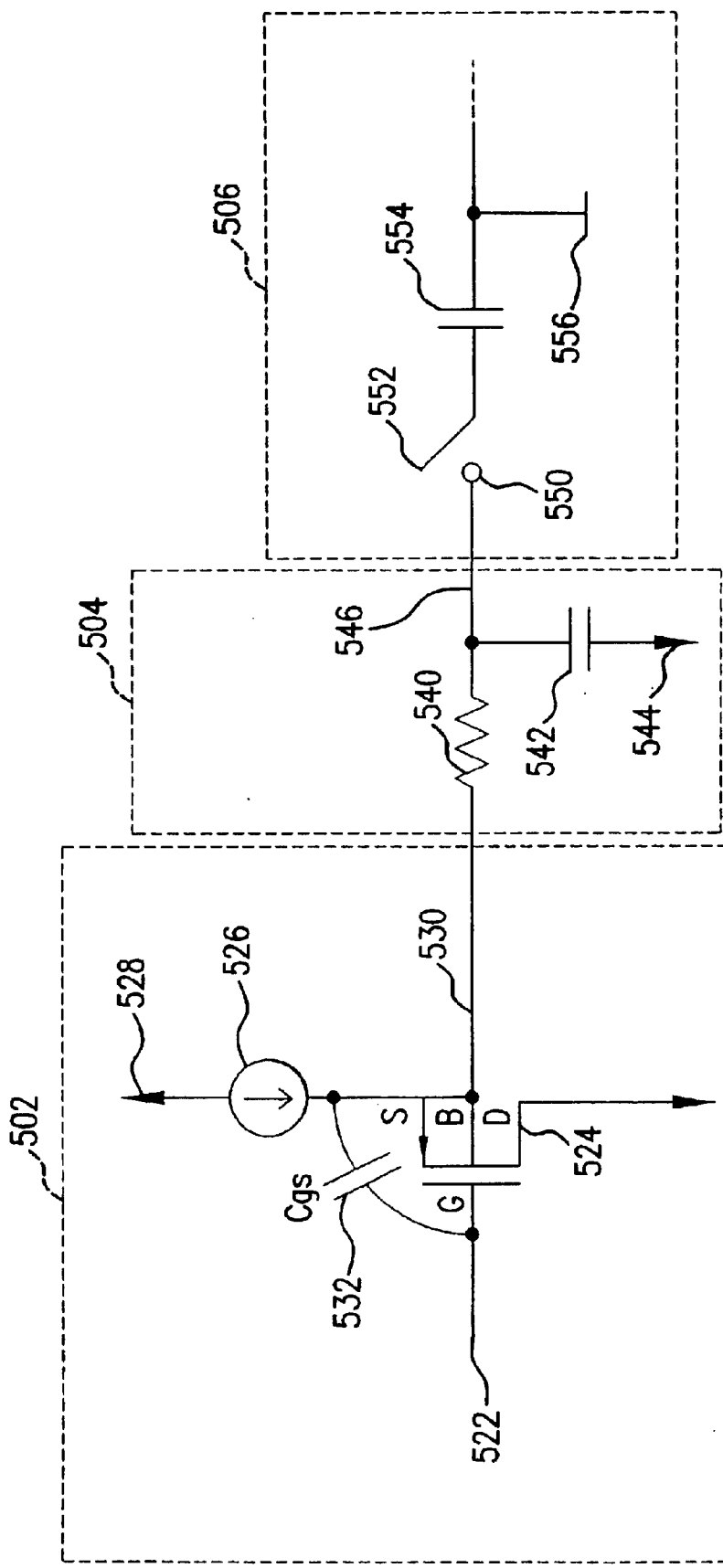
FIGS. 5A–5C are illustrations of circuits that reduce charge glitches in buffer circuit applications.
Figure 5B:
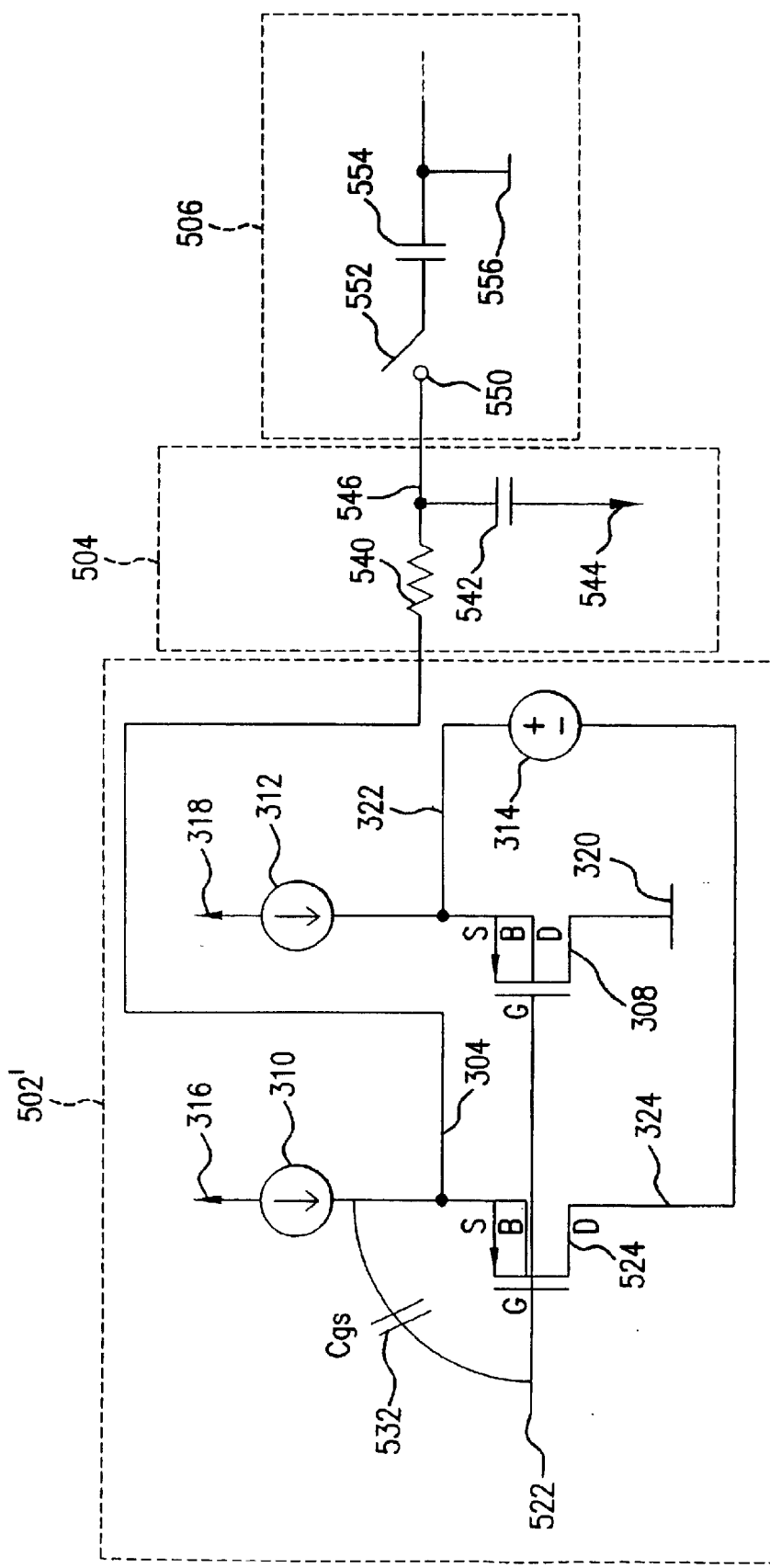
Figure 5C:
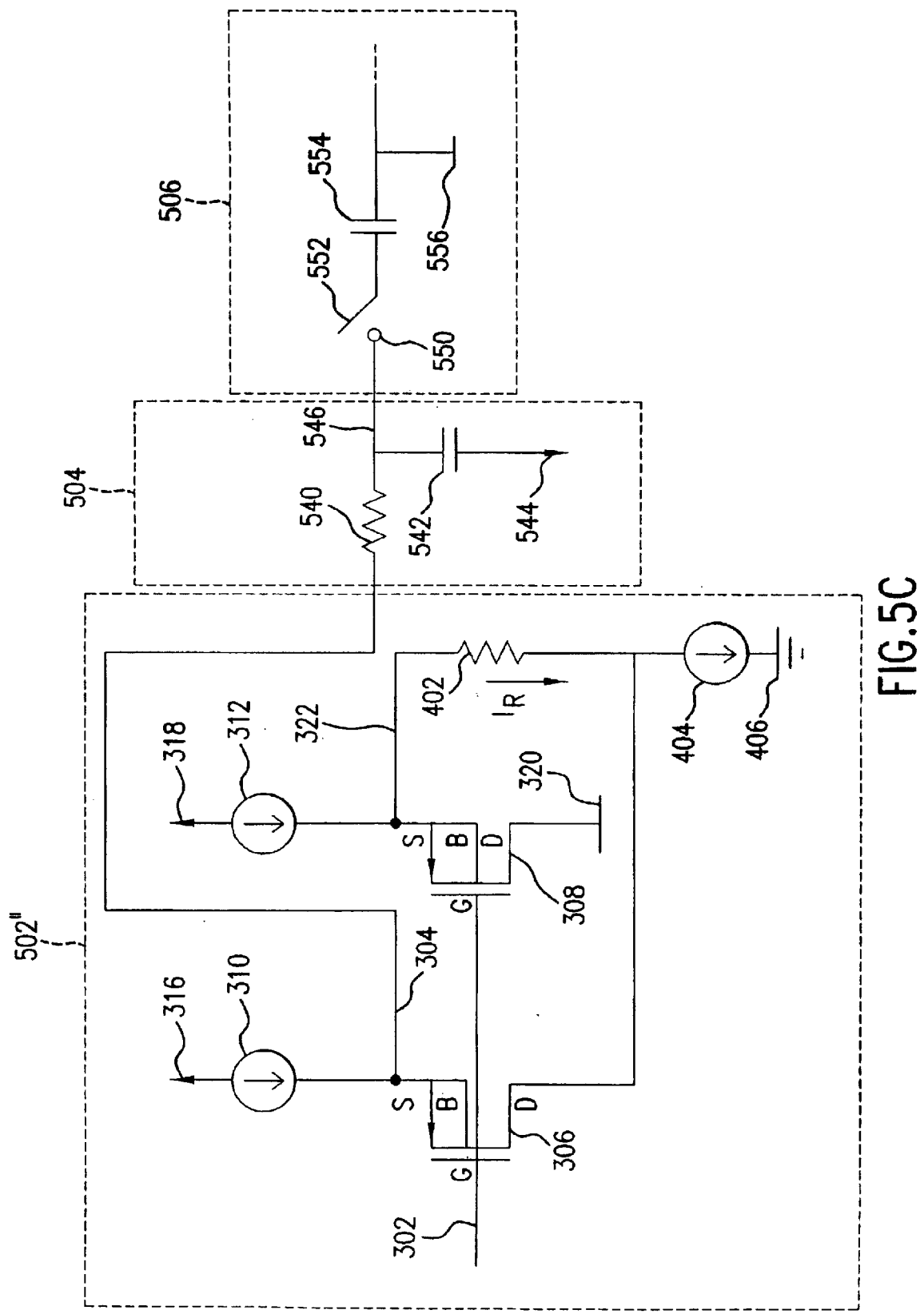

When a buffer circuit based on a source-follower transistor is driving certain circuits, such as a switched-capacitor sampling circuit, large voltage changes (referred to herein as charge glitches) may occur on the output terminal of the buffer. For buffers based on a source-follower transistor, these charge glitches are typically coupled back to the buffer's input terminal through a parasitic capacitance between the gate and source terminals of the source-follower transistor. FIGS. 5A–5C illustrate circuits that reduce charge glitches in buffer circuit applications.

FIG. 5A shows a buffer 502, a damping circuit 504, and a sampling circuit 506. Buffer 502 receives an input signal 522 at the gate terminal of a source follower transistor 524. The source terminal of transistor 524 is coupled to a current source 526. Current source 526 is, in turn, coupled to a voltage supply 528. Buffer 502 produces an output signal 530 at the source terminal (also referred to herein as the output terminal) of transistor 524.

Damping circuit 504 operates as an interface between buffer 502 and sampling circuit 506. In particular, damping circuit 504 prevents charge glitches caused by sampling circuit 506 from propagating to input signal 522 through a parasitic capacitance 532. Capacitance 532 (also referred to as $C_{gs}$) is inherent to transistor 524, and is not added separately during circuit implementation. The value of parasitic capacitance 532 depends on the region (e.g., saturation, triode, etc.) in which transistor 524 is operating.

Damping circuit 504 receives output signal 530 and produces a dampened signal 546, which is sent to sampling circuit 506. Damping circuit 504 operates as an resistance-capacitance (RC) low pass filter. However, damping circuit 504 may alternatively be implemented as other types of low pass filters and/or damping circuitry.

As shown in FIG. 5A, damping circuit 504 includes a resistor 540 and a capacitor 542. Resistor 540 is coupled between the source terminal of transistor 524 and an input terminal 550 of sampling circuit 506. Capacitor 542 is coupled between sampling circuit input terminal 550 and a ground node 544. The amount of damping provided by damping circuit 504 is directly proportional its time constant, $\tau = RC$, where R is the resistance of resistor 540 and C is the capacitance of capacitor 542.

Sampling circuit 506 receives signal 546 at input terminal 550. As shown in FIG. 5A, sampling circuit 506 is a switched-capacitor sampling circuit that includes a switch 552 and a capacitor 554. Switch 552 periodically closes for a sampling interval. During this sampling interval, capacitor 554 charges to the value of signal 546.

As described above, a charge glitch causes a sudden change in the source terminal voltage of transistor 524. This sudden change may be caused by closing switch 552 when the source voltage of transistor 524 (i.e., the magnitude of output signal 530) is different from the voltage across capacitor 554. A sudden change in the source terminal voltage of transistor 524 may also be caused by opening switch 552. When switch 552 is implemented in metal oxide semiconductor (MOS) technology, there are several well-known non-idealities that cause charge glitches. MOS switches produce charge glitches either when they are opened or when they are closed. These glitches are typically due to non-ideal clock feed-through and charge injection in the MOS switch devices.

The magnitude of the charge glitches which occur when switch 552 opens and closes depends on the magnitude of the signal voltage sampled across capacitor 554. The magnitude of this sampled signal depends upon input signal 522. The charge glitches cause the voltage at the source terminal of transistor 524 (i.e., the value of output signal 530) to change suddenly by a signal-dependent amount. These sudden signal-dependent voltage changes at the source terminal of transistor 524 cause a change in the charge stored in parasitic capacitance 532.

The signal-dependent charge flowing through parasitic capacitance 532 must be provided from the sourcing circuitry (not shown) which provides input signal 522. In any practical realization of this sourcing circuitry, the output impedance of this circuitry will be non-zero. Due to the non-zero output impedance, this sourcing circuitry is not capable of maintaining the desired input at input signal 522 when it is required to provide the signal-dependent charge flowing into parasitic capacitance 532. Therefore, input signal 522 becomes distorted. The degree of distortion in input signal 522 depends on several factors, including the output impedance of the sourcing circuitry, the output impedance at the source of transistor 524, and the amplitude of the charge glitches.

The employment of damping circuit 504 reduces the magnitude of charge glitches that can occur at the source terminal of source-follower transistor 524. This reduction occurs because capacitor 542 (rather than parasitic capacitance 532) provides a substantial portion of the charge required by sampling circuit 506 when switch 552 of sampling circuit 506 closes. Furthermore, glitches at input terminal 550 that occur when switch 552 opens or closes are isolated by resistor 540 from the source terminal of transistor 524. The magnitude of glitches at the source terminal of transistor 524 are reduced by the resistor divider ratio determined by the output impedance at the source of transistor 524 and the resistance value of resistor 540. The larger the value of resistor 540 relative to the output impedance of transistor 524, the more the glitches at the source of transistor 524 are reduced.

In designing damping circuit 504, the selection of values for resistor 540 and capacitor 542 is a design tradeoff between reducing the magnitude of charge glitches at the source terminal of transistor 524 and increasing the time constant, $\tau$, of damping circuit 504. If this time constant is too large, then the magnitude of signal 546 will not adequately track input signal 522.

Embodiments of the present invention may include other types of buffers coupled to damping circuit 504. For instance, FIG. 5B illustrates a buffer 502' replacing buffer 502. Buffer 502' is an implementation of buffer 300. As illustrated in FIG. 5B, input signal 302 replaces input signal 522 and output signal 304 replaces output signal 530.

Similarly, FIG. 5C illustrates a buffer 502", which is an implementation of buffer 400, replacing buffer 502. Like the buffer of FIG. 5B, input signal 302 replaces input signal 522 and output signal 304 replaces output signal 530 in FIG. 5C.

IV. Offset Adjustment

A source-follower transistor based buffer typically generates an output signal having a level that is offset in voltage from the level of the corresponding input signal by a voltage. This offset voltage is approximately equal to the voltage between the gate and source terminals (referred to herein as $V_{gs}$) of the buffer's source-follower transistor. Thus, a buffer input signal typically has a direct current (dc) level that is different from the dc level of the corresponding buffer output signal.

Buffer output signals typically drive an interfacing circuit, such as a switched-capacitor circuit. The performance of the interfacing circuitry typically depends on the dc level of the buffer output signals. For example, within a certain range of dc levels, the THD of the interfacing circuitry may be much lower (i.e. better) than outside of this range. In a similar manner, buffer circuit performance also typically depends upon the dc level of the input signal. Within a certain dc input level range, the buffer circuits may perform much better than outside of that range. If a buffer circuit (e.g., a source-follower buffer circuit) has a dc offset between the buffer input and output terminals, then the dc level at the input is different than the dc level at the output. In this type of buffer circuit, it is desirable to control the dc levels of the buffer input and output signals.

A problem with typical semiconductor manufacture technology is variability in the manufacturing process. Limited manufacture tolerances cause variations of transistor device parameters such as threshold voltage and mobility. For example, in typical processing of circuits employing MOSFET transistors, the $V_{gs}$ voltage of these transistors varies due to process variations of threshold voltage and mobility. These processing variations are typically small for transistor devices implemented on the same die or on the same wafer, while they can be large for transistor devices implemented on different wafers. Therefore transistor devices on the same die or wafer typically have substantially similar (i.e. matched) process parameters. The variations in the process parameters cause changes in the characteristics for transistors on these different wafers. These variations cause difference in the $V_{gs}$ voltage, or offset voltage, of source-follower buffer circuits. These changes in offset voltage cause inaccuracy in the dc levels of the buffer output signals. As previously mentioned, the performance of interfacing circuitry typically depends on the dc level of buffer output signals. Accordingly, it is desirable to control the dc level at the input of source follower buffer circuits such that the output dc level is maintained at the desired dc level.

The present invention provides a technique for setting the levels of buffer input and output signals. This technique relies upon matching of transistor devices on the same die, for example matching of the $V_{gs}$ voltage of source-follower buffer transistors and replica buffer transistors. By matching the buffer transistors on the same die, the offset voltages of source-follower buffer transistors and replica buffer transistors are made substantially equal. Accordingly, two interface circuits that each produce an output signal having an output signal level from an input signal are shown in FIGS. 6 and 7A–C. These drawings illustrate single-ended and differential signal applications.

Figure 6:
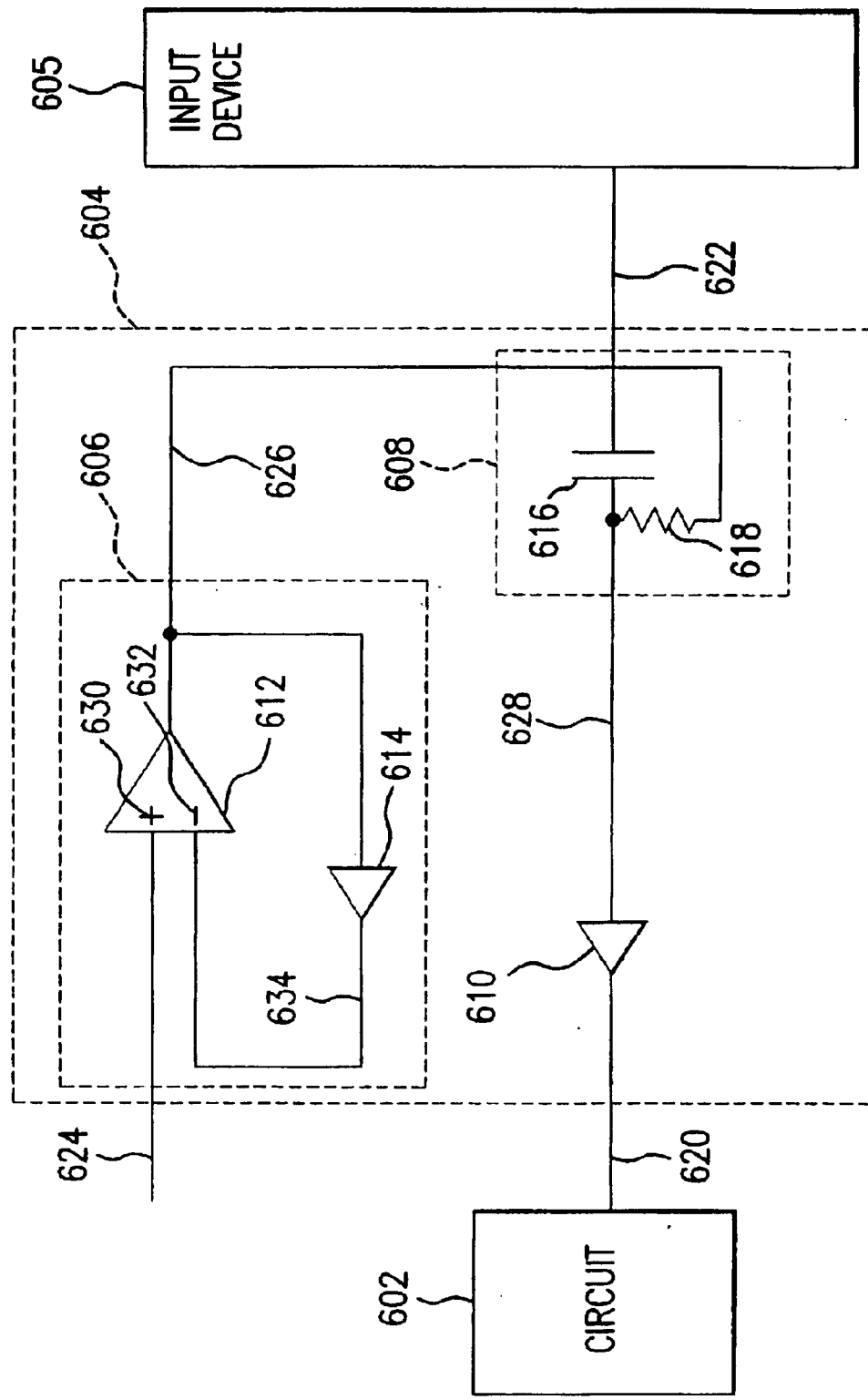
FIG. 6 is a diagram of an interface circuit application that sets single-ended input and output signal levels.

FIG. 6 is a diagram of a buffer circuit application in a single-ended signal application. This application includes a circuit 602 coupled to an interface circuit 604 that can adjust the dc levels of buffer input and output signals. As shown in FIG. 6, circuit 602 receives a single-ended buffer output signal 620 from interface circuit 604. Circuit 602 may be any type of circuit that receives single-ended signals. For example, circuit 602 may be a switched-capacitor sampling circuit and/or an analog-to-digital converter (ADC).

Interface circuit 604 receives a single-ended input signal 622 from an input device 605. From input signal 622, interface circuit 604 generates output signal 620. Signal 620 has a dc offset level that is adjusted according to an output level control signal 624 (also referred to herein as reference signal 624) that is applied to circuit 604 as an input. Level control signal 624 has a dc level that is set to a desired dc offset level for buffer output signal 620. Thus, signal 624 is the output signal 620 level.

As shown in FIG. 6, interface circuit 604 includes a level translation module 606, a level adjustment module 608, and a buffer 610. Level translation module 606 receives level control signal 624 and generates an input level control signal 626, which is sent to level adjustment module 608.

Level adjustment module 608 receives input level control signal 626 and produces an adjusted buffer input signal 628. Signal 628 has a dc offset level that is substantially equal to the value of input level control signal 626.

FIG. 6 illustrates module 608 including an ac-coupling capacitor 616 and a dc-biasing resistor 618. However, other dc offset adjustment techniques may be employed. For example, module 608 may include various types of high pass filters. Capacitor 616 has a first terminal that receives input signal 622 and a second terminal that is coupled to a first terminal of resistor 618. A second terminal of resistor 618 is coupled to the output terminal of offset translation module 606 (i.e., receives signal 626).

Level translation module 606 includes a difference amplifier 612, such as an operational amplifier (op-amp), and a replica buffer 614. Replica buffer 614 performs in substantially the same manner as buffer 610. That is, buffers 610 and 614 both generate output signals from corresponding input signals with substantially the same offsets (i.e., buffers 610 and 614 operate with substantially equal offsets). Accordingly, buffers 610 and 614 may each be based on a source-follower transistor. For example, buffers 610 and 614 may each be implemented as buffers 300 and 400 of FIGS. 3 and 4. Furthermore, buffers 610 and 614 may each include a damping circuit, such as damping circuit 504 in FIGS. 5A, and 5B.

Op-amp 612 has a positive input terminal 630 that receives level control signal 624 and a negative input terminal 632 that receives a replica buffer output signal 634.

Replica buffer 614 generates output signal 634 from input level control signal 626. Thus, negative feedback is employed with respect to op-amp 612. This negative feedback provides a dc level for signal 628 that will result in a dc level for buffer output signal 620 that is substantially equal to the value of control signal 624.

FIG. 7A is a diagram of a buffer circuit application in a differential signal application. This application includes a circuit 702 coupled to an interface circuit 704 that can adjust the common mode levels for buffer input and output signals.

As shown in FIG. 7A, circuit 702 receives a differential buffer output signal 720 from interface circuit 704. Differential signal 720 includes a positive component 720a and a negative component 720b. Circuit 702 may be any type of circuit that receives differential signals. For example, circuit 702 may be a switched-capacitor sampling circuit and/or an analog to digital converter (ADC).

Interface circuit 704 receives a differential input signal 722 from an input device 705. As shown in FIG. 7A, differential input signal 722 includes a positive component 722a and a negative component 722b. From input signal 722, interface circuit 704 generates output signal 720. Signal 720 has a common mode level that is adjusted according to an output level control signal 724 (also referred to herein as reference signal 724). Accordingly, control signal 724 has a dc level that is set to a desired common mode level for buffer output signal 720. Thus, signal 724 is the common-mode level for buffer output signal 720.

As shown in FIG. 7A, interface circuit 704 includes a level translation module 706, a level adjustment module 708, an optional filter 710, and buffers 712a and 712b. Level translation module 706 receives control signal 724 and generates an input level control signal 726, which is sent to level adjustment module 708.

Level adjustment module 708 receives input level control signal 726 and produces an adjusted buffer input signal 728. As shown in FIG. 7A, signal 728 is a differential signal having a positive component 728a and a negative component 728b. Signal 728 has a common mode level that is substantially equal to the value of input level control signal 726.

As shown in FIG. 7A, level adjustment module 708 includes ac-coupling capacitors 716a and 716b, and dc-biasing resistors 718a and 718b. However, other common mode level adjustment techniques may be employed. Capacitor 716a has a first terminal that receives positive input signal component 722a, and a second terminal that is coupled to a first terminal of resistor 718a at a node 750a. A second terminal of resistor 718a is coupled to the output terminal of offset translation module 706. Capacitor 716b has a first terminal that receives negative input signal component 722b, and a second terminal that is coupled to a first terminal of resistor 718b at a node 750b. A second terminal of resistor 718b is coupled to the output terminal of offset translation module 706.

Level translation module 706 includes a difference amplifier 713, such as an op-amp, and a replica buffer 714. Replica buffer 714 performs in substantially the same manner as buffers 712a and 712b. That is, buffers 712 and buffer 714 each operate with substantially equal offsets. Accordingly, buffers 712 and 714 may each be based on a source-follower transistor. For example, buffers 712 and 714 may each be implemented as buffers 300 and 400 of FIGS. 3 and 4. Furthermore, buffers 712 and 714 may each include a damping circuit, such as damping circuit 504 in FIGS. 5A, and 5B. Op-amp 713 has a positive input terminal 730 that receives level control signal 724 and a negative input terminal 732 that receives a replica buffer output signal 734.

Replica buffer 714 generates output signal 734 from input level control signal 726. Thus, negative feedback is employed with respect to op-amp 713. This negative feedback provides a common mode level for differential signal 728 that will result in a common mode level for buffer output signal 720 that is substantially equal to the value of control signal 724.

Filter 710 receives differential signal 728 and generates a differential filtered signal 729, which includes a positive component 729a and a negative component 729b. Filter 710 may be a low pass filter, such as an anti-aliasing filter for applications where circuit 702 is a sampling circuit and/or an ADC.

FIG. 7A illustrates filter 710 as a low pass anti-aliasing filter. Anti-aliasing filter 710 includes resistors 740a and 740b, ground capacitors 742a and 742b, and a differential capacitor 744. Resistor 740a has a first terminal that is coupled to node 750a, and a second terminal that is coupled to a first terminal of capacitor 742a. A second terminal of capacitor 742a is coupled to a ground node.

Resistor 740b has a first terminal that is coupled to node 750b, and a second terminal that is coupled to a first terminal of capacitor 742b. A second terminal of capacitor 742b is coupled to a ground node.

As shown in FIG. 7A, capacitor 744 is coupled between the respective second terminals of resistors 740. Capacitor 744 improves the common mode rejection of filtered signal 729 by providing substantially similar capacitances to signal components 729a and 729b.

Applications of interface circuit 704 may include configurations where circuit 702 is speech encoder/decoder (CODEC) and device 705 is a serial line interface circuit (SLIC). Two such examples are described herein with reference to FIGS. 7B and 7C.

FIG. 7B illustrates an implementation where an interface circuit 704' is coupled between a CODEC 702' and a differential SLIC 705'. CODEC 702' includes an ADC 703 to convert analog differential signal 720 into a digital signal. However, ADC 703 may include multiple ADCs, each of which is used to digitize analog signal 720.

CODEC 702' provides output level control signal 724 to interface circuit 704. However, in further embodiments, signal 724 may be provided by circuits other than CODEC 702'. SLIC 705' includes a tip interface 760 and a ring interface 762. These interfaces communicate with a telephony device. In addition, SLIC 705' receives input level control signal 726 from interface circuit 704.

As shown in FIG. 7B, interface circuit 704' is similar to interface circuit 704 of FIG. 7A. However, interface circuit 704' does not include level adjustment module 708. This is because SLIC 705' produces signal 722 having a common mode level that is substantially equal to the value of input level control signal 726.

FIG. 7C illustrates an implementation where interface circuit 704 is coupled between CODEC 702' and a single-ended SLIC 705". Accordingly, SLIC 705" provides a single-ended signal 722a, while signal 722b is coupled to a ground node 764. SLICs, such as SLIC 705", typically include analog circuitry. However, CODECs typically include digital circuitry, and thus have common-mode noise. In order to provide immunity to common-mode noise, CODEC 702' receives a differential signal 720. Interface circuit 704 provides symmetric balanced impedances in both the positive and negative signal paths. This ensures that the circuit will provide high common-mode rejection of coupled common-mode noise.

FIGS. 7B and 7C provide two embodiments of the present invention. In further embodiments, interface circuits, such as interface circuits 704 and 704' may be incorporated into CODECs or into SLICs. In still further embodiments, some, but not all, components of the interface circuits may be incorporated into CODECs and/or SLICs.

The SLICs described herein may be differential SLICs. Alternatively, the SLICs described herein may have conventional SLIC and single-ended-to-differential interface circuits. One embodiment of such a SLIC is described in U.S. patent application Ser. No. 09/579,932 entitled "SLIC Architecture and Interfaces," filed May 26, 2000. This patent application is incorporated herein by reference in its entirety.

V. Current Sources

The buffers illustrated in FIGS. 3, 4, 5A–5C include current sources that may be implemented according to various techniques that are known to persons skilled in the relevant arts. In embodiments of the present invention, these current sources are implemented as current sources 250 and 280.

FIGS. 8–11 provide examples of implementations for biasing circuits 246 and 276. These implementations are shown to provide examples, and are not to be limiting. Thus, other biasing circuit implementations may be employed within the scope of the present invention.

FIG. 8 is a diagram of a biasing circuit 800 that generates bias voltages at nodes 820 and 822. Node 820 couples to the gate terminal of a current source transistor (e.g., transistors 236 and 266). Node 822 couples to the gate terminal of a cascode transistor (e.g., transistors 234 and 264).

In FIG. 8, a biasing circuit 800 includes transistors 802, 804, and 806. As depicted, these transistors are each P-channel MOSFETs. However, other types of transistors may be used. Biasing circuit 800 further includes current sources 808 and 810. Transistors 802, 804, and 806 each have gate (G), source (S), and drain (D) terminals. The source terminals of transistors 806 and 802 are coupled to voltage supplies 812 and 814, respectively. Current sources 808 and 810 are coupled to ground nodes 816 and 818, respectively.

In FIG. 9, a biasing circuit 900 generates bias voltages at nodes 920 and 922. Node 920 couples to the gate terminal of a current source transistor, while node 922 couples to the gate terminal of a cascode transistor.

Biasing circuit 900 includes a transistor 902, which is illustrated as a P-channel MOSFET having source (S), gate (G), and drain (D) terminals. However, other types of transistors may be used. Biasing circuit 900 further includes a resistor 904 and a current source 906. As shown in FIG. 9, the source terminal of transistor 902 is coupled to a voltage supply 908 and a terminal of current source 906 is coupled to a ground node 910.

Figure 10:
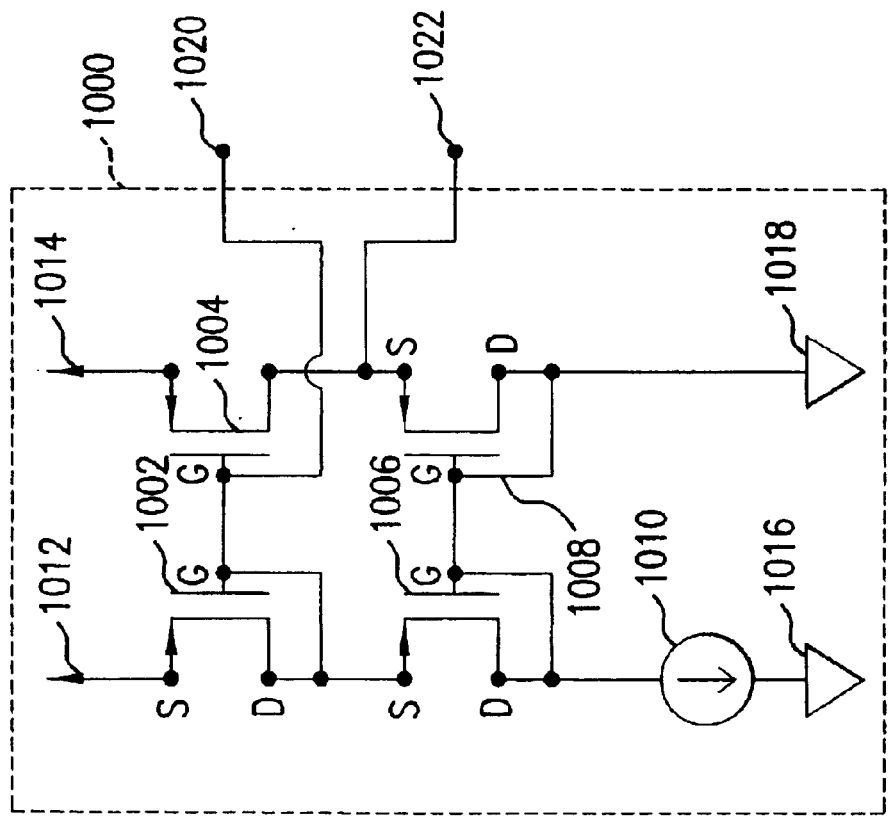

In FIG. 10, a biasing circuit 1000 includes transistors 1002, 1004, 1006, and 1008, each having source (S), gate (G), and drain (D) terminals. These transistors are shown as P-channel MOSFETs. However, other types of transistors may be employed. Biasing circuit 1000 further includes a current source 1010. The source terminals of transistors 1002 and 1004 are coupled to voltage supplies 1012 and 1014, respectively. The drain terminal of transistor 1008 is coupled to a ground node 1018, while a terminal of current source 1010 is coupled to a ground node 1016.

Biasing circuit 1000 generates bias voltages at nodes 1020 and 1022. Node 1020 couples to the gate terminal of a current source transistor, while node 1022 couples to the gate terminal of a cascode transistor.

Figure 11:
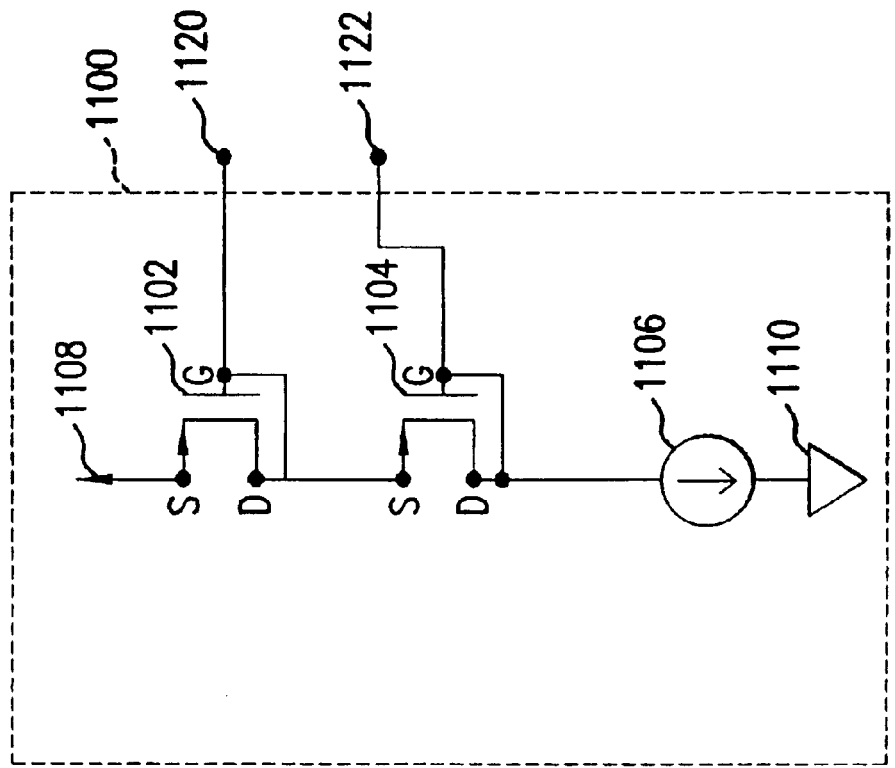

FIG. 11 illustrates a biasing circuit 1100 that includes transistors 1102 and 1104, and a current source 1106. As shown in FIG. 11, transistors 1102 and 1004 are P-channel MOSFETS that each have source (S), gate (G), and drain (D) terminals. However, other types of transistors may be employed.

Biasing circuit 1100 generates bias voltages at nodes 1120 and 1122. Node 1120 couples to the gate terminal of a current source transistor, while node 1122 couples to the gate terminal of a cascode transistor. As shown in FIG. 11, the source terminal of transistor 1102 is coupled to a voltage supply 1108, while a terminal of current source 1106 is coupled to a ground node 1110.

VI. Conclusion

While various embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A circuit, comprising:
    a buffer;
    a sampling circuit capable of storing a charge of a sample, the sampling circuit having a switch, an input, and an output; and
    a damping circuit coupled between the buffer and the input of the sampling circuit;
    wherein the damping circuit is adapted to reduce charge glitches when the switch closes;
    wherein the sampling circuit is switched-capacitor sampling circuit, wherein the switched-capacitor sampling circuit includes a capacitor having a first node and second node, and wherein the first node is coupled to the switch and the second node is coupled to the output of the sampling circuit.

2. The circuit of claim 1, wherein the damping circuit comprises a low pass filter.

3. The circuit of claim 2, wherein the low pass filter is an RC low pass filter.

4. The circuit of claim 1, wherein the buffer includes a transistor having a source and a body, and wherein the source and the body are coupled to each other to reduce a signal dependent current.

5. The circuit of claim 1, wherein the buffer includes
a transistor having a source; and
a current source coupled between the source and a voltage supply.

6. A circuit, comprising:
a buffer,
a sampling circuit having a switch; and
a damping circuit coupled between the buffer and the sampling circuit;
wherein the damping circuit is adapted to reduce charge glitches when the switch closes; and
wherein the buffer includes a source-follower transistor adapted to generate an output signal from an input signal,
a replica transistor adaptd to generate a replica signal from the input signal, and
a level shifting circuit that provides a level-shifted replica signal at a terminal of the source-follower transistor.

7. The circuit of claim 6, wherein at least one of the source-follower transistor and the replica transistor has a source and a body, and wherein the source and the body are coupled to eachother to reduce a signal dependent current.

8. The circuit of calim 6, wherein the buffer further includes a current source coupled between a source of the source-follower transistor and a voltage supply.

9. The circuit of claim 6, wherein the buffer further includes a current source coupled between a source of the replia transistor and a voltage supply.

10. The circuit of claim 6, wherein the sampling circuit is a switched-capacitor sampling circuit.

11. The circuit of claim 10, wherein the switched-capacitor sampling circuit includes an input, an output, and a capacitor having a first node and a second node, wherein the input of the switched-capacitor sampling circuit is coupled to the damping circuit, and wherein the first node of the capacitor is coupled to the switch and the second node of the capacitor is coupled to the output of the switched-capacitor sampling circuit.

12. The circuit of claim 6, wherein the damping circuit includes a low pass filter.

13. The circuit of claim 12, wherein the low pass filter is an RC low pass filter.

14. The circuit of claim 6, wherein the level shifting circuit is coupled between a source of the replica transistor and a drain of the soure- follower capacitor.

15. The circuit of claim 6, wherein the terminal of the source-follower transistor is a drain of the source-follower transistor.

16. The circuit of claim 6, wherein the level shifting circuit includes a voltage source coupled between a source of the replica transistor and the terminal of the source-follower transistor.

17. The circuit of claim 6, wherein the level shifting circuit includes a resistor and a current source, and wherein the resistor is coupled between a source of the replica transistor and the terminal of the source-follower transistor.

18. A circuit comprising:
a buffer including a transistor having a source and a body;
a sampling circuit capable of storing a charge of a sample, the sampling circuit including a switch, an input, and an output; and
a damping circuit coupled between the buffer and the input of the sampling circuit;
wherein the damping circuit is capable of reducing a charge glitch in response to the switch being opened or closed;
wherein the sampling circuit is switched-capacitor sampling circuit, wherein the switched-capacitor sampling circuit includes a capacitor having a first node and a second node, and wherein the first node is coupled to the switch and the second node is coupled to the output of the sampling circuit; and
wherein the source and the body of the transistor are coupled to each other to reduce a signal dependent current.

* * * * *

UNITED STATES PATENT AND TRADEMARK OFFICE
CERTIFICATE OF CORRECTION

PATENT NO. : 7,049,848 B2  
APPLICATION NO. : 10/626701  
DATED : May 23, 2006  
INVENTOR(S) : Brooks et al.

Page 1 of 1

It is certified that error appears in the above-identified patent and that said Letters Patent is hereby corrected as shown below:

On the title page under References Cited, U.S. Patent Documents, please insert:
--4,886,986    12/1989    WATANABE    327/310  
6,556,068 B2   04/2003    FORBES et al.    327/537  
4,633,424      12/1986    NORBERG et al.   702/87--

In claim 1, column 12, line 57, an indefinite article --a-- should be inserted before the word "second".

In claim 7, column 13, line 24, "eachother" should be replaced with --each other--.

In claim 8, column 13, line 25, "calim" should be replaced with --claim--.

In claim 14, column 14, line 7, "soure- follower" should be replaced with --source-follower--.

In claim 18, column 14, line 30, an indefinite article --a-- should be inserted before the word "switched-capacitor".

Signed and Sealed this

Fourteenth Day of November, 2006

JON W. DUDAS  
*Director of the United States Patent and Trademark Office*